United States Patent
Solon

(10) Patent No.: US 9,589,752 B2
(45) Date of Patent: Mar. 7, 2017

(54) DISCONNECT CABINET WITH WIRELESS MONITORING CAPABILITY

(71) Applicant: Dean Solon, Gallatin, TN (US)

(72) Inventor: Dean Solon, Gallatin, TN (US)

(73) Assignee: Shoals Technologies Group, LLC, Portland, TN (US)

( * ) Notice: Subject to any disclaimer, the term of this patent is extended or adjusted under 35 U.S.C. 154(b) by 253 days.

(21) Appl. No.: 14/269,093

(22) Filed: May 3, 2014

(65) Prior Publication Data

US 2014/0327325 A1    Nov. 6, 2014

Related U.S. Application Data

(60) Provisional application No. 61/818,940, filed on May 3, 2013.

(51) Int. Cl.
| | |
|---|---|
| *H01H 47/00* | (2006.01) |
| *H05K 5/00* | (2006.01) |
| *H01H 71/10* | (2006.01) |
| *H02J 3/04* | (2006.01) |
| *H01H 71/56* | (2006.01) |

(52) U.S. Cl.
CPC ...... *H01H 47/002* (2013.01); *H01H 71/1018* (2013.01); *H05K 5/0004* (2013.01); *H05K 5/0017* (2013.01); *H01H 71/56* (2013.01); *Y10T 29/49117* (2015.01); *Y10T 307/747* (2015.04)

(58) Field of Classification Search
CPC ........................................................ H02H 3/04
USPC ............................................................ 307/113
See application file for complete search history.

(56) References Cited

U.S. PATENT DOCUMENTS 3,324,258 A * 6/1967 Foti ........................ H01H 3/22
                                                                200/48 R

* cited by examiner

*Primary Examiner* — Robert Deberadinis
(74) *Attorney, Agent, or Firm* — Carla Gannon Law

(57) ABSTRACT

A disconnect system for a solar installation shuts down power upstream from an inverter, so that it is safe for solar field personnel to perform work related to a solar installation. The system actuates multiple disconnect devices in one motion by a linkage assembly which can associate 2-4 disconnect switches with a single handle. This system preferably includes hardware and logic for monitoring the current and voltage output of electrically coupled combiner/recombiner boxes in the solar field, and for wirelessly transmitting this data to a user. A single disconnect cabinet can accommodate 2-20 inputs from associated recombiner boxes with 5 handles or less.

14 Claims, 7 Drawing Sheets

DISCONNECT CABINET WITH WIRELESS MONITORING CAPABILITY

CROSS-REFERENCE TO RELATED APPLICATIONS

This application claims priority from the United States provisional patent application entitled DISCONNECT CABINET AND RECOMBINER BOX WITH WIRELESS MONITORING CAPABILITY, which was filed on May 3, 2013, and assigned the Ser. No. 61/818,940.

This application is being filed concurrently with a United States utility application entitled MASTER RECOMBINER BOX WITH WIRELESS MONITORING CAPABILITY, which also claims priority from the provisional patent application entitled DISCONNECT CABINET AND RECOMBINER BOX WITH WIRELESS MONITORING CAPABILITY, which was filed on May 3, 2013, and assigned the Ser. No. 61/818,940. This application has a Ser. No. 14/269,095, and is hereby incorporated in its entirety.

BACKGROUND

Field

The present invention relates generally to solar energy components, and more particularly, to a cabinet that disconnects power upstream from an inverter in a solar field, monitors the power output of downstream combiner/recombiner boxes, and wirelessly transmits data related to that monitoring.

Related Art

A utility grade solar installation typically includes a plurality of solar collectors electrically grouped in an array. Direct Current (DC) power from each solar collector in the array is combined in a combiner box. A plurality of combiner boxes are electronically coupled to a recombiner box, which further combines the DC power. A plurality of recombiner boxes feed into an inverter, which converts the DC power into Alternating Current (AC) power, which is subsequently transmitted via power lines.

A variety of problems may decrease the power production of a given solar field. For example, individual solar collectors may be damaged, shaded, or have faulty connections such that power is not produced, is inadequately produced, or the generated power never makes it to the collector. Technology for monitoring power production at the solar panel level is disclosed in U.S. patent application Ser. No. 12/871,234, having a filing date of Aug. 30, 2010, which is hereby incorporated by reference in its entirety. Problems can also arise at the recombiner box level, which can significantly affect the power output of the field. Technology for combining and monitoring at the industrial-grade recombiner box level, typically 100-600 amps, is disclosed in the aforementioned concurrently filed United States utility application entitled MASTER RECOMBINER BOX WITH WIRELESS MONITORING CAPABILITY.

However, before any work can be performed, it is essential that all power is completely shut down. Accidental contact between solar field personnel and a "live" system is likely to be catastrophic for the personnel.

Typically, solar field personnel shuts down a "live" system by actuating disconnect switches or circuit breakers to disrupt the power supply circuit. Disconnect switches are commonly coupled to handles to make "flipping the switch" easier to accomplish and confirm. It is standard in the industry that a single switch or breaker is associated with one input terminal. Thus, if a system having 20 input channels must be shut off, the personnel must turn 20 handles. This can be time consuming and laborious.

Thus, there remains a need for a system that allows a user to actuate multiple disconnect switches simultaneously. It is desirable that this system is self-contained, preferably in a portable cabinet. It is desirable that this system can be connected with other cabinets to easily accommodate the total number of channels leading to an inverter. It is also desirable that this system can monitor power output at downstream combiner/recombiner boxes, and wirelessly transmit this data to a user.

SUMMARY OF THE INVENTIONS

The present invention is directed to a system for shutting down power upstream from an inverter, so that it is safe for solar field personnel to perform work related to a solar installation. This system preferably includes hardware and logic for monitoring the current and voltage output of combiner/recombiner boxes in the solar field, and for wirelessly transmitting this data to a user. A single disconnect cabinet can accommodate 2-20 inputs from 2-20 associated recombiner boxes, respectively.

A system of the present invention is configured to actuate multiple disconnect devices in one motion. This is accomplished using a linkage assembly which can associate 2-4 disconnect devices with a single handle.

A system of the present invention is preferably configured to monitor associated combiner/recombiner boxes. In the monitoring system a plurality of current transducers (CTs), each associated with a single input, are communicatively connected to a monitoring control circuit board that is mounted on the inside surface of the cabinet door. The data from the CTs is encoded and transmitted by a radio frequency RF) transmitter to a receiver that is communicatively coupled to a processor. Received and analyzed data can be displayed, and alerts can be sent, for example via text message, to notify a user of specific issues. The monitoring system is powered by a power supply.

The ability to monitor up to 20 input circuits is accomplished via multiple cabinets connected together to form one continuous cabinet which houses the disconnect devices and the monitoring equipment.

One side of the power circuit is routed through the disconnect device, and the other side of the power circuit is attached to the bus bars at the bottom of the cabinet. It is possible to land a ground wire for each circuit.

DESCRIPTION OF THE PREFERRED EMBODIMENTS

Figure 1:
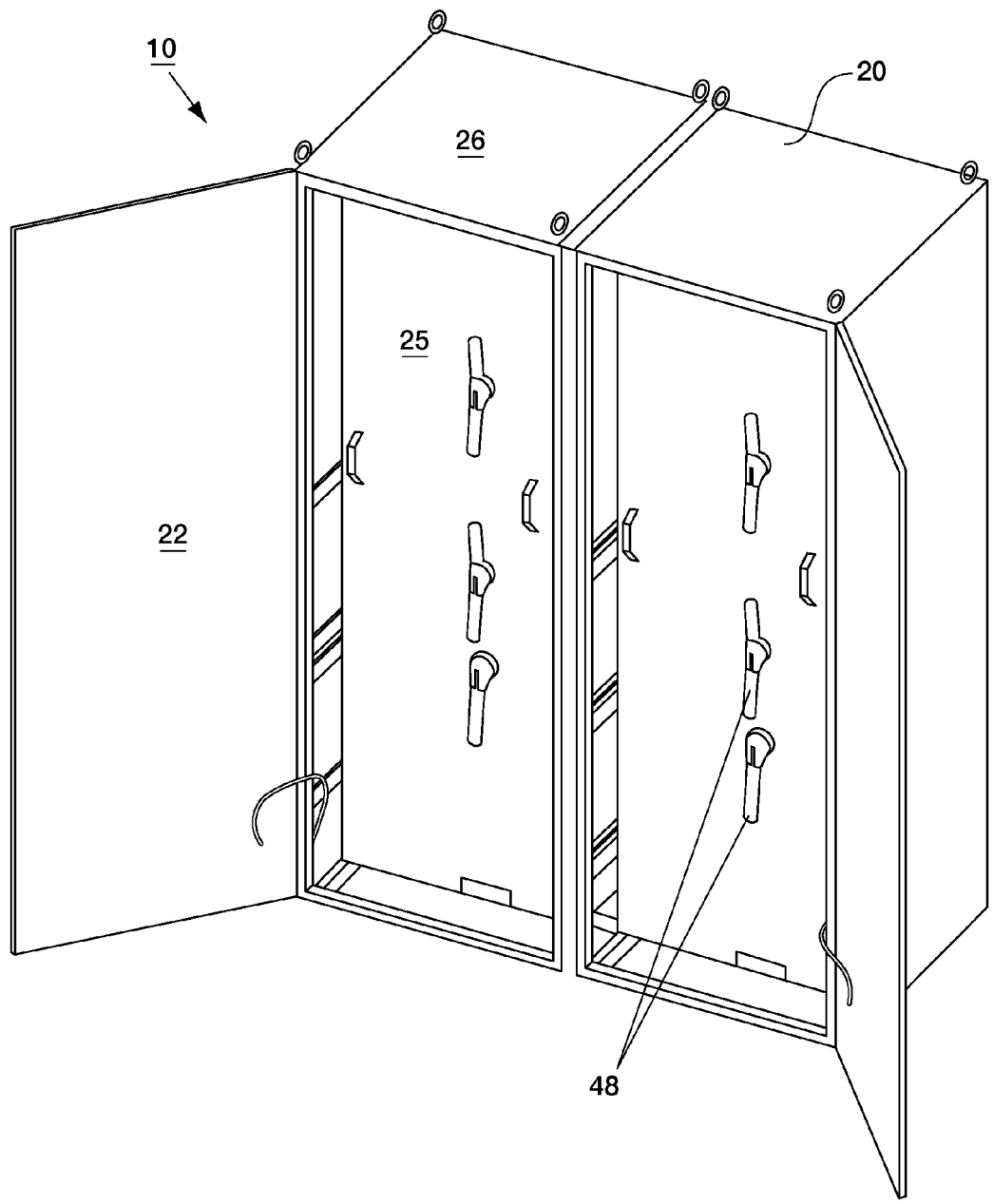
FIG. 1 is a perspective view of an embodiment of the present invention with the cabinet doors open.

In the following description, like reference characters designate like or corresponding parts throughout the several views.

The following terms will apply:
10—Disconnect system;
12—Universal bus bar;
20—Cabinet;
22—Door;
24—Hinge;
25—Safety shield;
26—Housing;
30—Disconnect switch;
32—High voltage positive input bus bar;
34—High voltage positive output bus bar;
36—High voltage bus bar;
37—Ground bus bar
40—Disconnect assembly;
42—Linkage assembly;
43—Switch fitting;
44—Switch-to-switch arm;
46—Shaft;
48—Handle;
60—Control circuit board;
62—Power supply;
65—Current transducer (CT);
70—Antenna;
72—Receiver; and
74—Processor.

As shown in FIG. 1, disconnect system 10 is substantially maintained within cabinet 20 including housing 26 and doors 22. Doors 22 are closed during normal operation, but open to provide access to structures within housing 26. Removable safety shields 25 are positioned in front of structures within housing, but with handles 48 mounted to the safety shield.

Figure 2:
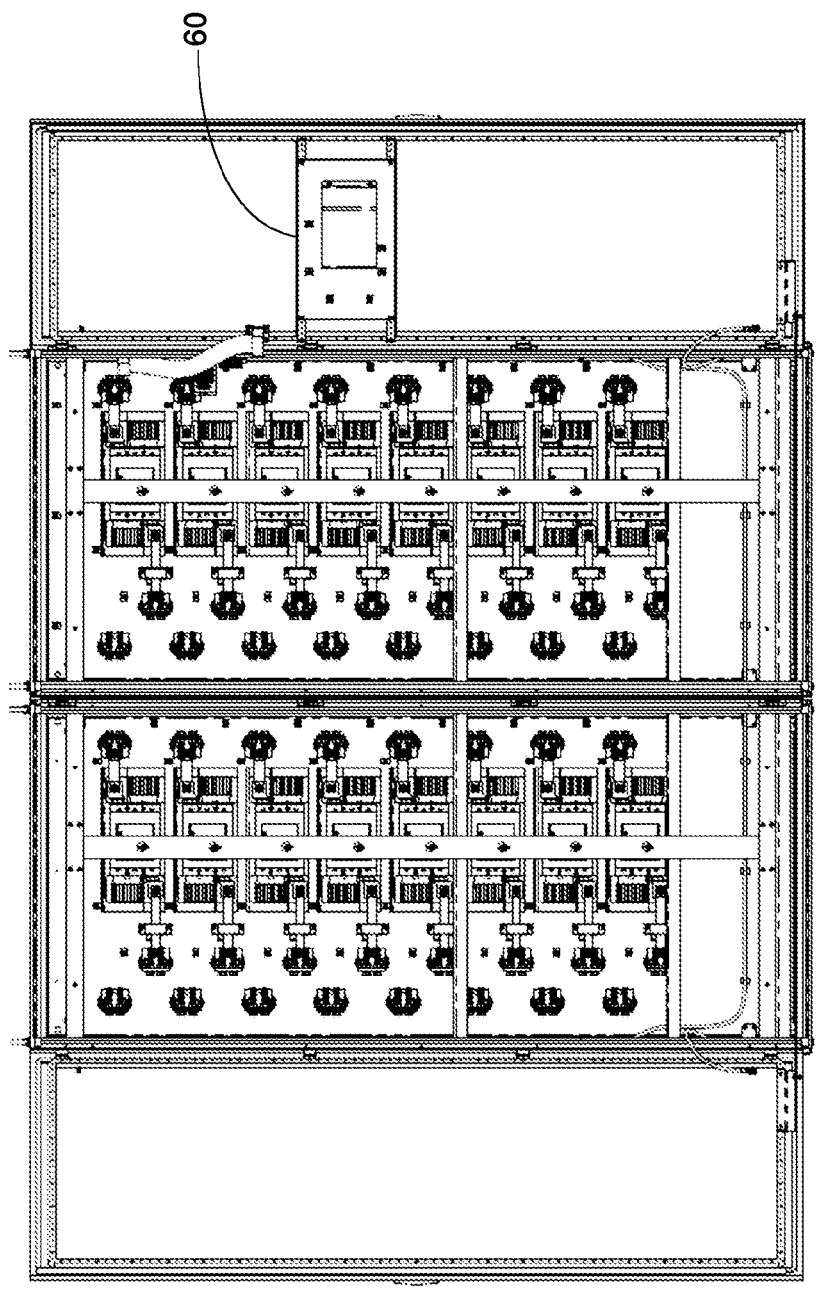
FIG. 2 is a front view of an embodiment having monitoring ability.

FIG. 2 shows a preferred embodiment of disconnect system 10 having monitoring ability. In this embodiment control circuit board 60 is preferably positioned on a door. Circuit control circuit board 60 is preferably powered by commercially available power supply 62 (not shown) for stepping down 120V or 240V AC to 24V DC.

Figure 3:
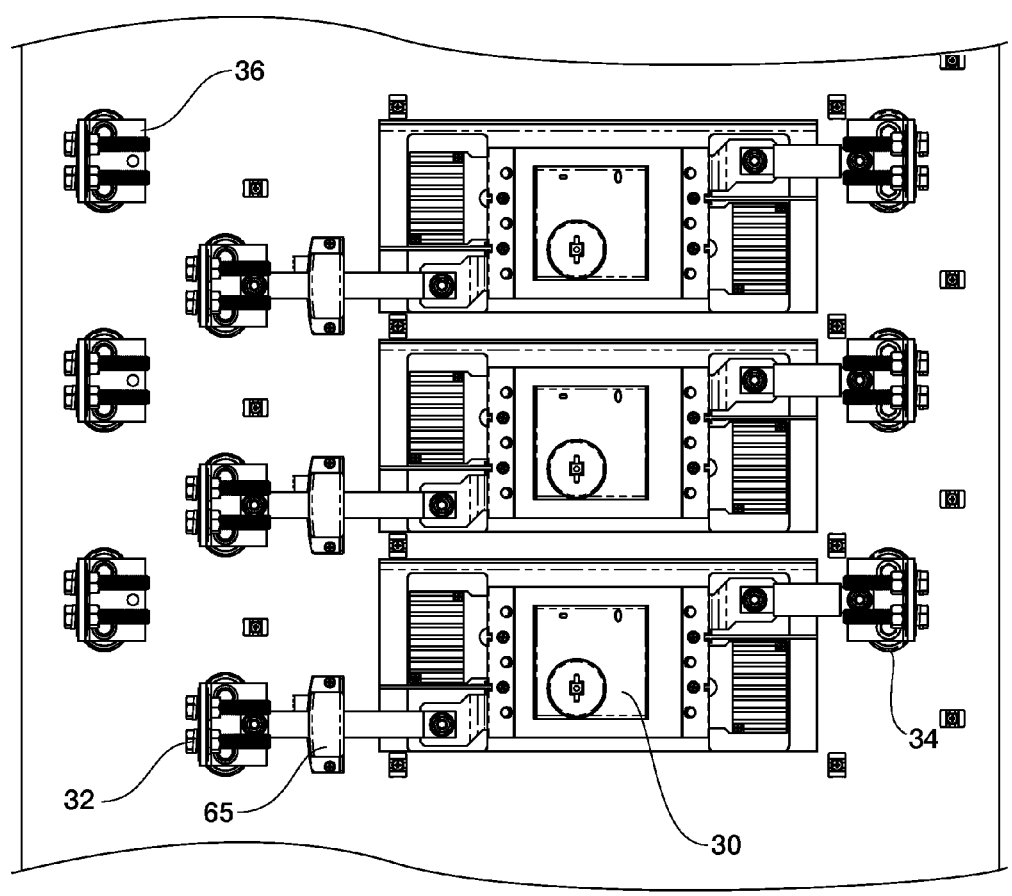
FIG. 3 is a front view of a plurality of disconnect switches and associated structures.

FIG. 3 shows disconnect switches 30 and some surrounding structures including high voltage bus bars 32 and current transducers (CTs) 65. Where a high voltage positive bus bar is associated with a CT, as shown in the lower left (numbered) assembly, the combination structure is an input bus bar. This is functionally and structurally different from a high voltage negative bus bar 36 without a CT, as depicted in the upper left structure. Power travels from a recombiner box (unnumbered) to high voltage positive input bus bar 32, through disconnect switch 30, to high voltage positive output terminal blocks 34. An actuated disconnect switch would break the circuit, and prevent power from reaching output terminal block 34, and therefore the upstream inverter (not shown).

A suitable high voltage bus bar is ¼" plated copper material capable of carrying the required current. A suitable disconnect switch is OTDC400US22, ABB, Wichita Falls, Tex. A suitable output terminal block is ¼" plated copper material capable of carrying the required current.

Figure 4:
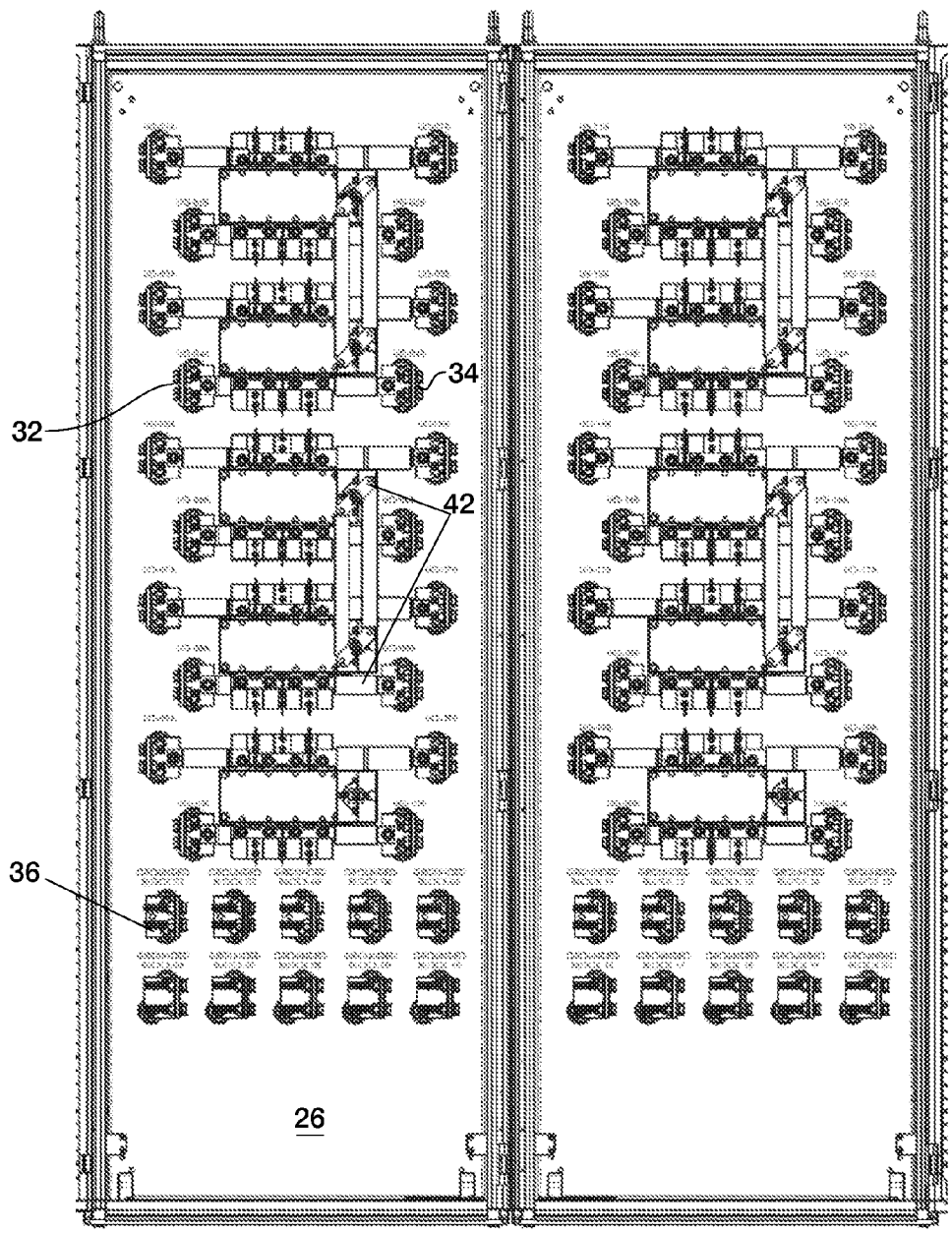
FIG. 4 is a front view of an embodiment having 20 channels.

FIG. 4 depicts a 20 channel system configured such that pairs of channels share a central disconnect switch, shown best in the bottom (unlinked) pairs. In this embodiment, pairs of disconnect switches are connected by linkage assemblies 42. In this manner a single linkage assembly can actuate two disconnect switches, and therefore four circuits. A single handle is associated with a single linkage assembly, thereby allowing a single handle to shut off as many as 4 circuits in one motion. As shown in FIG. 1, this orientation would require only 6 handles 48, instead of 20, as would be necessary if each disconnect switch were coupled to a single handle, in the conventional manner. NEC NFPA 70 Section 690.13 (C)(4) allows for a photovoltaic system to consist of no more than six switches or handles in a single enclosure.

FIG. 4 also depicts a plurality of high voltage negative bus bars 36. The high voltage wire terminals mount on these bus bars. One terminal is placed on each side of the vertical portion of the bus bar with a bolt through both terminals and the bus bar. Adding an "additional" terminal block for terminating the high voltage negative enables the system to terminate the high voltage positive that is getting switched.

Figure 5:
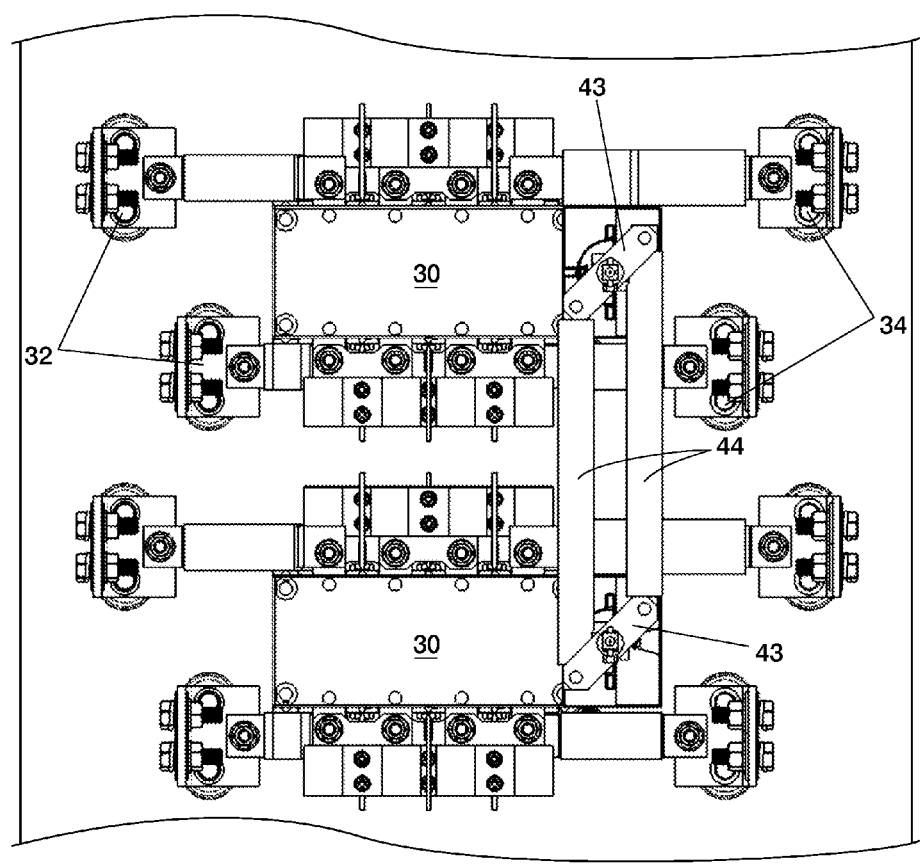
FIG. 5 is a front view of linked disconnect switches.

FIG. 5 provides a closer look at structures of the present invention. Switch fitting 43 is connected to underlying disconnect switches 30. Spanning the two switch fittings is a pair of substantially parallel switch-to-switch arms 44, which mechanically link the two disconnect switches. In other words, rotating one switch fitting would rotate the underlying disconnect switch, as well as the nearby disconnect switch that is linked by the switch-to-switch arms.

Figure 6:
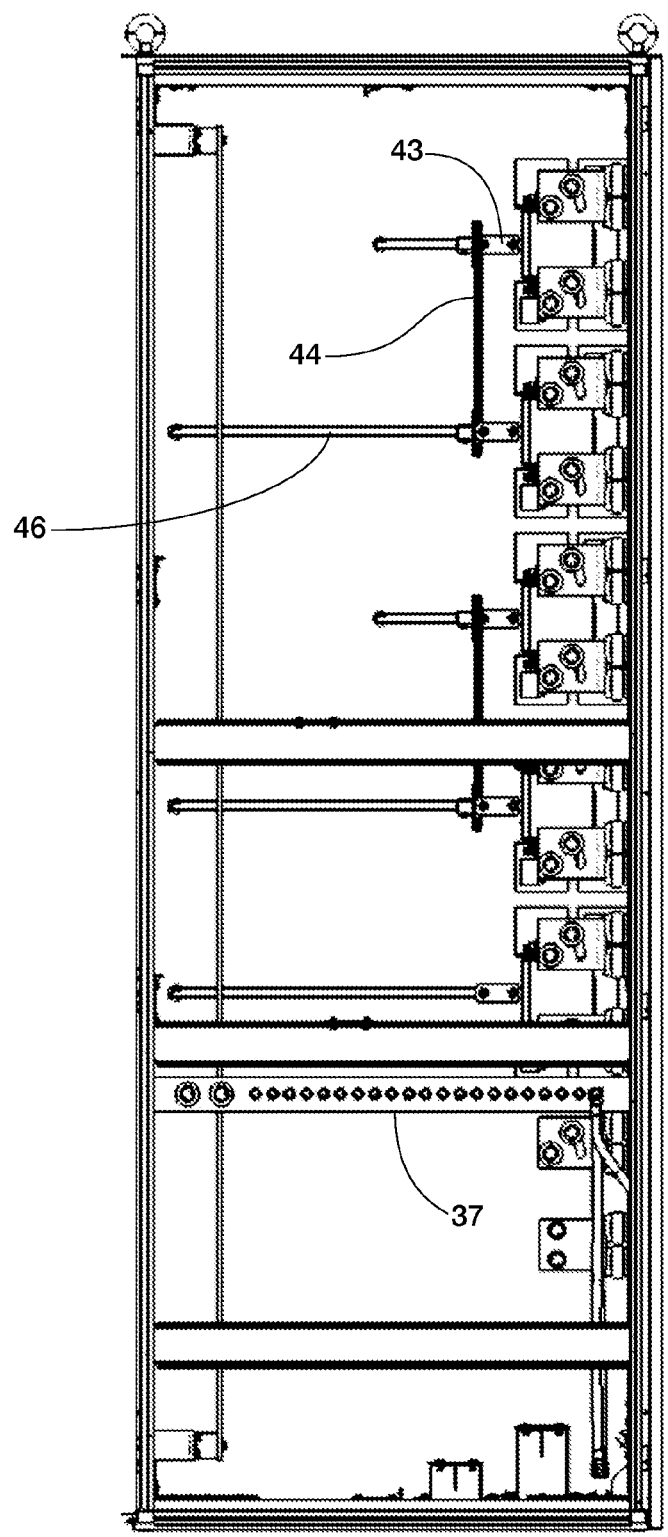
FIG. 6 is a side view of an embodiment with the cabinet's side panel removed.

As shown in the side view of FIG. 6, switch fitting 43 includes shaft 46 which extends outwardly from the disconnect switch (not numbered). Switch-to-switch arms 44 preferably connect at shafts 46 of switch fitting 43. Each shaft 46 terminates in handle 48.

Figure 7:
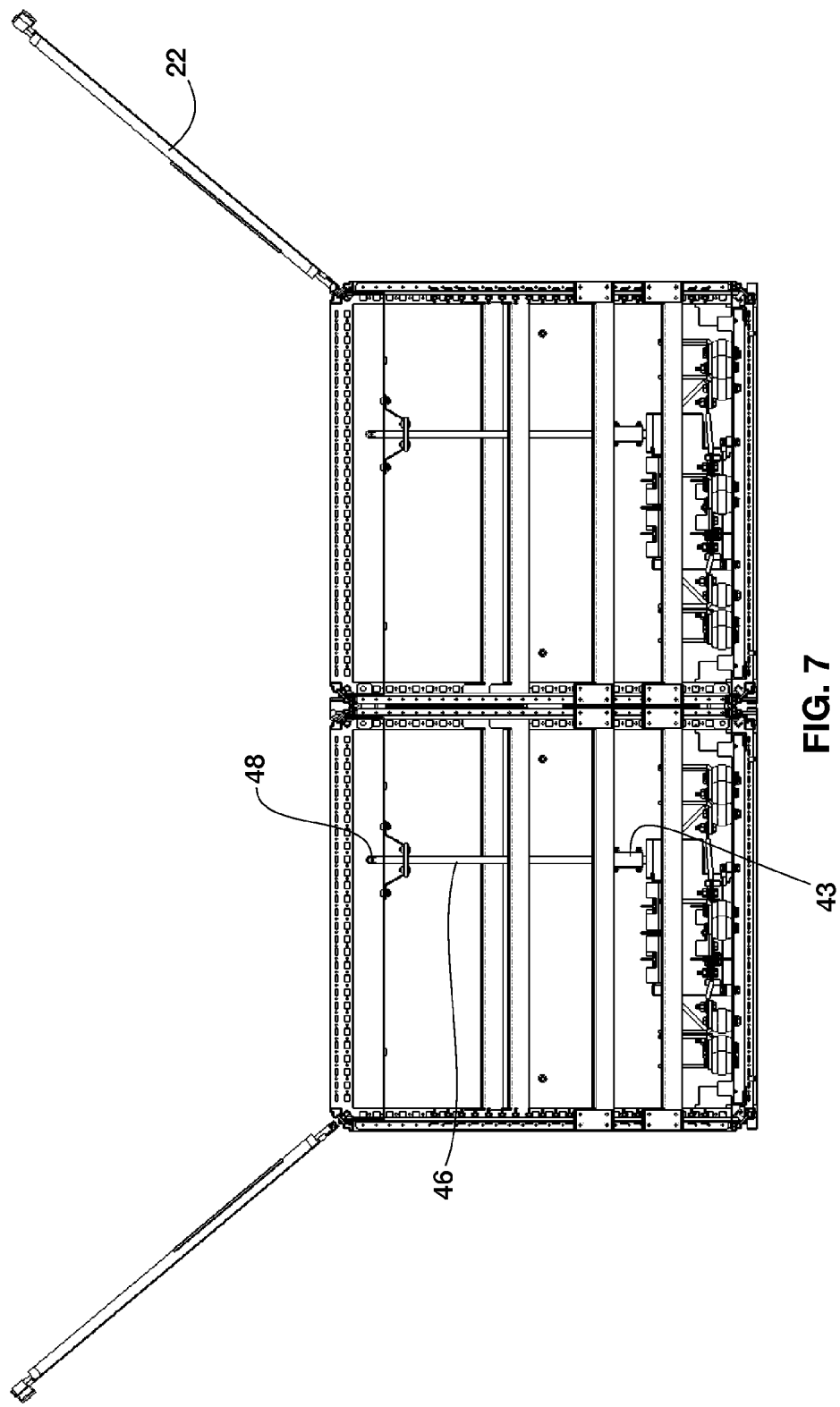
FIG. 7 is a bottom view of an embodiment of the cabinet.

The top view depicted in FIG. 7 shows that shaft 46 terminates in handle 48 at safety shield (not numbered).

Referring back to FIG. 3, current transducer 65 is communicatively connected to control circuit board 60 (FIG. 60). Although not shown, control circuit board 60 is preferably communicatively linked to antenna 70, which transmits data via RF signals to receiver 72. Processor 73 employs logic to analyze and display data received by receiver 72. In this manner a user can access a computer, and preferably a password protected internet site, in order to view the energy output of specific recombiner boxes in a solar field. The system can also be configured to allow alerts to be sent to users when specific thresholds are reached, for example a 90% drop in power output within 10 minutes. Alerts can be delivered wirelessly in a variety of manners including emails and text messages.

In use, disconnect systems of the present invention are used in a solar installation upstream from the inverter. When it is necessary for solar field personnel to power down the system to perform work or maintenance, they would access disconnect system 10, open doors 22 of cabinet 20, and rotate all handles 46. They could optionally confirm that that system is powered down by consulting data from the monitoring system. If it is necessary to service the disconnect system itself 10, safety shields 25 would be removed. When all work is performed, and the solar installation is to powered back on, all handles 46 are returned to the original position so circuits are complete.

Certain modifications and improvements will occur to those skilled in the art upon a reading of the foregoing description. By way of example, the disconnect assemblies could be used in other settings where it is advantageous to actuate a plurality of disconnect switches at one time. Also, depending on where in the solar energy installation the disconnect system is employed, other components, such as combiner boxes, may be monitored. Also, it is possible to vary the number of circuits that are associated with a single disconnect switch, therefore affecting the number of circuits that can be turned on or off by the turn of a handle. Also, the manner in which 36, 32, and 34 are connected electrically through the switch will also allow this product to serve a variety of different configurations in the solar field. For example, the system can be positively fused, negatively fused, floating ground, and Bi-polar. Also, the system could provide arc fault protection.

It should be understood that many modifications and improvements have been deleted herein for the sake of conciseness and readability but are properly within the scope of the following claims. It should also be understood that the illustrations are for the purpose of describing a preferred embodiment of the inventions and are not intended to limit the inventions thereto. It should also be understood that approximations allow variances of +/−10%, unless otherwise noted. As used herein, "substantially" and the like shall mean that the statement is generally true, notwithstanding minor variances due to materials, unusual properties or situations, irregularities, human limitations, expected human behavior, and so forth. By way of example, "substantially permanently attached" would mean an attachment would sustain regular usage, but could be separated through unusual effort. It should also be understood that all ranges set forth inherently include the endpoints themselves, as well as all increments, therebetween.

I claim:

1. A disconnect system for a solar field comprising:
   A) At least one high voltage positive input bus bar;
   B) A plurality of disconnect switches electrically coupled with at least one of said high voltage positive input bus bars;
   C) A plurality of handles mechanically engaged with said disconnect switches, wherein said quantity of switches is greater than said quantity of handles; and
   D) A current transducer between said at least one high voltage positive input bus bar and said disconnect switches.

2. The disconnect system of claim 1 wherein each of said handles is engaged with exactly two switches.

3. The disconnect system of claim 1 wherein said handles are mechanically engaged with said disconnect switches via a linkage assembly.

4. The disconnect system of claim 3 wherein said linkage assembly includes two substantially parallel switch-to-switch arms.

5. The disconnect system of claim 1 wherein said current transducer is electrically coupled with a control circuit board.

6. A system for simultaneously monitoring multiple recombiner boxes in a solar field comprising:
   A) Two disconnect switches engaged with a single handle such that said handle can actuate both switches with one motion;
   B) At least one high voltage positive input bus bar electrically coupled with said disconnect switch;
   C) A current transducer positioned between said high voltage positive input bus bar and said disconnect switch;
   D) A control circuit board communicatively coupled with said current transducer; and
   E) An RF antenna communicatively coupled with said control circuit board, said RF antenna capable of transmitting data collected by said current transducer.

7. The monitoring system of claim 6 further comprising a receiver communicatively coupled with said RF antenna.

8. The monitoring system of claim 7 further comprising a processor communicatively coupled with said receiver.

9. The monitoring system of claim 8 further comprising logic for analyzing and displaying data collected by said current transducer.

10. The monitoring system of claim 9 further comprising an alert system.

11. A method of configuring a solar energy installation comprising the steps of:
    A) Electrically coupling a first plurality of solar panels to a first combiner box;
    B) Electrically coupling a second plurality of solar panels to a second combiner box;
    C) Electrically coupling said first combiner box and said second combiner box to a first recombiner box;
    D) Electrically coupling a third plurality of solar panels to a third combiner box;
    E) Electrically coupling a fourth plurality of solar panels to a fourth combiner box;
    F) Electrically coupling said third combiner box and said fourth combiner box to a second recombiner box;
    G) Electrically coupling said first recombiner box and said second recombiner box in a disconnect cabinet wherein both recombiner boxes are coupled to a single shut-off handle; and
    H) Transmitting said current output measurement through an antenna.

12. The method of claim 11 further comprising the step of measuring the current output of said first recombiner box with a first current transducer located within said disconnect cabinet.

13. The method of claim 12 further comprising the step of measuring the current output of said second recombiner box with a second current transducer located within said disconnect cabinet.

14. The method of claim 11 further comprising the step of alerting a user when said current output measurement falls below a pre-established threshold.

* * * * *